(12) United States Patent
Dietz

(10) Patent No.: US 6,552,543 B1
(45) Date of Patent: Apr. 22, 2003

(54) MAGNETIC RESONANCE TOMOGRAPHY APPARATUS WITH VIBRATION-DECOUPLED OUTER ENVELOPE

(75) Inventor: Peter Dietz, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/645,359

(22) Filed: Aug. 25, 2000

(30) Foreign Application Priority Data

Aug. 26, 1999 (DE) .......................................... 199 40 551

(51) Int. Cl.⁷ ................................................. G01N 3/00
(52) U.S. Cl. ....................................... 324/318; 334/322
(58) Field of Search ................................ 324/318, 307, 324/309, 320, 322

(56) References Cited

U.S. PATENT DOCUMENTS

| | | |
|---|---|---|
| 4,537,033 A | 8/1985 | Kamil |
| 5,129,232 A | 7/1992 | Minas et al. |
| 5,345,177 A | 9/1994 | Sato et al. |
| 5,363,077 A * | 11/1994 | Herd et al. ................. 335/216 |
| 5,446,433 A | 8/1995 | Laskaris et al. |
| 5,524,636 A * | 6/1996 | Sarvazyan et al. .......... 600/410 |
| 5,548,653 A | 8/1996 | Pla et al. |
| 5,617,026 A | 4/1997 | Yoshino et al. |
| 5,698,980 A | 12/1997 | Sellers et al. |
| 5,794,210 A * | 8/1998 | Goldhaber et al. ........... 705/14 |
| 6,043,653 A * | 3/2000 | Takamori et al. ........... 324/300 |
| 6,404,200 B1 * | 6/2002 | Dietz et al. ................. 324/318 |

FOREIGN PATENT DOCUMENTS

EP    0 467 558    1/1992

\* cited by examiner

Primary Examiner—Edward Lefkowitz
Assistant Examiner—Dixomara Vargas
(74) Attorney, Agent, or Firm—Schiff Hardin & Waite

(57) ABSTRACT

A magnetic resonance tomography apparatus has a basic field magnet system and at least one oscillation source. An outer envelope of the basic field magnet system, to which the oscillation source is mechanically connected, thereby comprises at least a part of a decoupling mechanism that prevents a propagation of oscillations caused by the oscillation source onto at least a sub-region of the outer envelope.

30 Claims, 5 Drawing Sheets

MAGNETIC RESONANCE TOMOGRAPHY APPARATUS WITH VIBRATION-DECOUPLED OUTER ENVELOPE

BACKGROUND OF THE INVENTION

1. Field of the Invention

The invention is directed to a magnetic resonance tomography apparatus of the type that contains a basic field magnet system as well as a gradient coil system.

2. Description of the Prior Art

Magnetic resonance tomography is a known technology for acquiring images of the inside of objects, particularly, the body of a living examination subject. To this end, the magnetic resonance tomography apparatus has a volume for acceptance of the examination subject, referred to as an examination volume. The examination volume is at least partly spatially limited by a surface of the apparatus that surrounds it. The majority part of the aforementioned limiting surface is normally formed by a surface belonging to the gradient coil system, and a further part, which is normally only a small part, is formed by a part of an outer envelope of the basic field magnet system. At least in a sub-region of the examination volume, the basic field magnet system generates an optimally uniform, static basic magnetic field on which the gradient coil system superimposes rapidly switched magnetic field with constant gradients, referred to as gradient fields, in all three spatial directions. Currents flow in the gradient coils with amplitudes that reach several 100 A and that are subject to frequent and fast changes in the direction of the current, with rise and decay rates of several 100 kA/s. These currents are controlled on the basis of pulse sequences and, due to Lorentz forces, cause vibrations of the gradient coil system, given a basic magnetic field on the order of magnitude of 1 Tesla.

These vibrations are transmitted to the entire surface of the magnetic resonance tomography apparatus via various propagation paths. Dependent on their surface speed, the mechanical oscillations of various surface regions are transmitted as sound oscillations that ultimately cause the known noise emissions.

The overall surface of a magnetic resonance tomography apparatus is essentially formed by the outer envelope of the basic field magnet system, which forms by far the largest part, as well as the surface of the gradient coil system, including the devices such as radio-frequency antennas mounted at the gradient coil system. Regardless of the measuring location, the envelope of the basic field magnet system is the dominant noise source. This is also true of the examination volume, which is essentially limited by the surface of the gradient coil system.

One transmission path dominates in the transmission of the vibrations of the gradient coil system onto the envelope of the basic field magnet system. This proceeds via a direct mechanical connection of the gradient coil system to the basic field magnet system, for example due to the gradient coil system being press fit in a hollow opening of the basic field magnet system.

Progress in the field of magnetic resonance tomography for shortening the measuring times and for improving imaging properties is always related to faster and faster pulse sequences. These cause an increase in the current amplitudes as well as in the current rise and decay rates in the gradient coils. Without counter-measures, this leads to increasing noise due to higher Lorentz forces and rapid changes in the effective direction of the Lorentz forces due to stronger vibrations.

Excessively high noise phenomena can be opposed, for example, by increasing the rigidity of the gradient coil system. A doubling of the rigidity, however, only yields an increase of the natural resonant frequencies of the vibrating components by a factor of approximately 1.4. Since the gradient coil system is already a very stiff element at present, technical and economic limits exist as to the increase in rigidity, which is practical.

German OS 195 31 216 discloses a magnetic resonance tomography apparatus with a gradient coil system secured to the basic field magnet system via at least one support mount, the support mount being located in the region of a natural oscillation node of the gradient coil system which is expected during operation. In one embodiment, the support mount includes a damping element. Disadvantageous influences caused by oscillations of the gradient coil system, for instance acoustic and structural noises, as well as disturbances in the image quality are avoided as a result. However, as soon as the gradient coil system exhibits greater rigidity compared to the envelope of the basic field magnet system, the support mount—including the damping elements—leads to hardly any noticeable reduction in noise because no effective decoupling of the vibration-generating gradient coil system from the outer envelope is achieved.

U.S. Pat. No. 5,345,177 discloses a gradient coil system for a magnetic resonance tomography apparatus that is mechanically connected to a basic field magnet system of the apparatus via vibration-damping connector elements. A vibration decoupling of the gradient coil system from the basic field magnet system thereby occurs in defined fashion by means of the vibration-damping connector elements. The entire basic field magnet system is thus kept free of vibrations that proceed from the gradient coil system. For noise reduction as well as a high magnetic resonance image quality, a vibration as well as a deformation of the operating gradient coil system are also prevented.

German OS 44 32 747 discloses a fundamental reduction of oscillations of the gradient coil system on the basis of an active technique. To that end, a force generator, particularly containing piezoelectric components, is arranged in or at the gradient coil system. This generates forces that oppose the oscillations of the gradient coil system, so that a deformation of the gradient coil system is essentially prevented. To that end, the piezoelectric components are appropriately driven by a voltage applied thereto. The introduction or attachment of a number of piezoelectric components into the comparatively spatially extensive gradient coil system, the voltage supply thereof, as well as, an appropriate drive circuit, involve significant technical and economic outlay.

SUMMARY OF THE INVENTION

An object of the present invention is to provide an economical magnetic resonance tomography apparatus with low noise emissions that, among other things, avoids the aforementioned disadvantages.

This object is inventively achieved in a magnetic resonance tomography apparatus having an outer envelope of the basic field magnet system to which the source of the oscillations is mechanically connected, with this outer envelope forming at least one part of a decoupling mechanism that prevents propagation of oscillations caused by the source of oscillations onto at least a sub-region of the outer envelope. As a result, vibration of by far the majority part of the surface of the magnetic resonance tomography apparatus is suppressed or reduced to a minimum. In particular, the decoupling mechanism prevents oscillatory movement of the envelope that is characterized by a motion direction perpendicular to the surface of the envelope and is thus especially relevant for producing noise. The dominant noise source is thus suppressed or reduced. Because the envelope forms part of the decoupling mechanism, the decoupling mechanism acts directly at the location of the conversion of mechanical oscillations into noise-producing sound oscillations. An effective point of employment of the decoupling mechanism can be defined in a simple way. Further, the effects of the decoupling mechanism on the overall system are relatively easily determinable.

In an embodiment, a connector between the oscillation source and the basic field magnet system contains a part of the decoupling mechanism. In an embodiment that saves components and space this connector participates at a point of employment for the decoupling mechanism together with the basic field magnet, particularly the outer envelope thereof.

In a further embodiment, the decoupling mechanism contains an element, such as a bellows or an element of elastic material, that has a vibration-decoupling effect due to its mechanical properties.

In a further embodiment, the decoupling mechanism contains actuators, preferably fashioned as piezo elements, whose spatial size is designed such that they have a vibration-decoupling effect.

In another embodiment, the decoupling mechanism includes sensors for this purpose, preferably embodied as piezo elements, that are arranged in the immediate proximity of the actuators for detecting the vibration and controlling the actuators. German OS 44 32 747 cited above is referenced for a detailed explanation of the above-described, active measure with actuators and sensors for vibration suppression. Compared to the structure taught in that reference, however, the present invention does not employ a multitude of piezo elements arranged over a comparatively spatially extensive oscillation source, for example a gradient coil system; rather, piezo elements are arranged in a comparatively small spatial region, for example in the proximity of a connection between the oscillation source and the basic field magnet system. There, they prevent transmission of oscillations of the oscillation source onto the entire envelope of the basic field magnet system. The economic outlay therefor is correspondingly lower and a high noise-reducing effect is still achieved.

In an especially advantageous embodiment, the actuators or sensors are fashioned as lamellae and/or fibers and/or films, and are attached on the surface of the decoupling mechanism and/or are integrated in the decoupling mechanism. Particularly the attachment to the surface, for example on the envelope of the basic field magnet system, requires only minimal modifications of existing components.

In another advantageous embodiment, the decoupling mechanism contains a stiffening element. The oscillation-decoupling effect of the decoupling mechanism, particularly between a comparatively rigid oscillation source and an envelope that is soft compared thereto, is enhanced by a supplementary utilization of the stiffening elements, particularly in conjunction with aforementioned other embodiments of the decoupling mechanism. Due to oscillation reflections at the stiffening elements, however, the utilization of the stiffening elements by themselves also leads to an oscillation-decoupling effect.

In another embodiment, the oscillation source is a gradient coil system. The gradient coil system of a magnetic resonance tomography apparatus is the main source of noise, so particular significance is accorded to the decoupling thereof.

In another embodiment, the decoupling mechanism is arranged for this purpose in a region wherein the envelope is not covered by a surface of the gradient coil system facing directly toward the envelope. This takes into account the fact that only oscillations of the outer envelope of the basic field magnet system that are not covered by surfaces of the gradient coil system, i.e. that represent surfaces of the magnetic resonance tomography apparatus, convert mechanical oscillations into noise-producing sound oscillations. The oscillations of the covered regions of the envelope are of no interest in view of the noise.

In a further embodiment, the decoupling mechanism is arranged for this purpose along a closed curve proceeding on the envelope, preferably along a closed boundary curve between a region in which the envelope is covered by the surface of the gradient coil system facing directly toward the envelope and a region that is not covered. This assures that the oscillation source is completely vibration-decoupled from the rest of the apparatus, so that no bridges remain via which the oscillation source can transmit oscillations onto the overall envelope of the basic field magnet system.

The inventive magnetic resonance tomography apparatus can have a hollow-cylindrical basic field magnet system having an opening in which the gradient coil system is connected to the basic field magnet system via the connectors.

In another embodiment wherein a cold head of a superconductive basic field magnet is the oscillation source, the decoupling mechanism is arranged along a closed curve in a transition region of the cold head into the basic field magnet system. As a result, transmission of oscillations from the cold head onto the surface of the rest of the apparatus is prevented and the cold head is suppressed as a source of noise.

DESCRIPTION OF THE PREFERRED EMBODIMENTS

Figure 1:
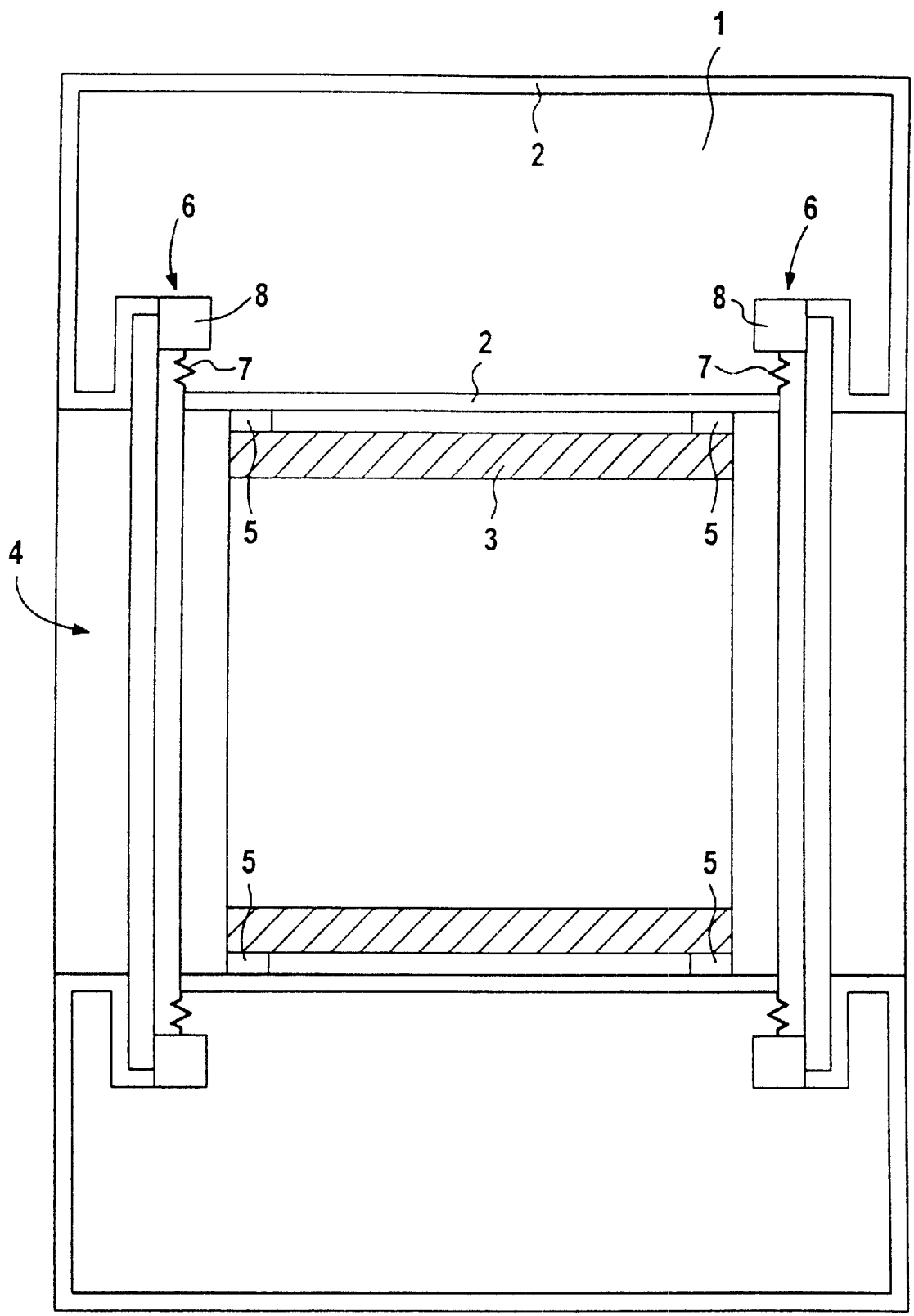
FIG. 1 is a longitudinal section through a magnetic resonance tomography apparatus in accordance with the invention with a decoupling mechanism that has stiffening rings and a number of bellows.

As one embodiment of the invention, FIG. 1 shows the longitudinal section of a magnetic resonance tomography apparatus having a hollow-cylindrical basic field magnet system 1. The outer envelope 2 of the basic field magnet system is shown, and forms the surface of the apparatus in that region wherein it is not covered by the gradient coil system 3. Within the hollow opening 4 of the basic field magnet system 1, the gradient coil system 3 is connected to the envelope 2 of the basic field magnet system 1 via the connecting mechanism 5. So that oscillations of the gradient coil system 3 are not transmitted via the connecting mechanism 5 onto the entire outer envelope 2, the outer envelope 2 has a two-piece decoupling mechanism 6, each part being formed by an annularly circumferential bellows 7 as well as a stiffening ring 8. The decoupling mechanism 6 is arranged in the envelope 2 so that it is not visible from the outside. Oscillations arising in that region of the outer envelope 2 that is covered by the gradient coil system 2 are inconsequential for the effectiveness of the decoupling. The decoupling mechanism 6 particularly prevents transmission of oscillations of the gradient coil system 3 in the circumferential direction. These are especially relevant as to noise production. The decoupling mechanism 6 is comparatively stiff in the direction of the principal cylinder axis of the basic field magnet system 1. For example, this prevents oscillation of the overall gradient coil system 3 in the direction of the principal cylinder axis from leading to distortions on magnetic resonance images.

Figure 2:
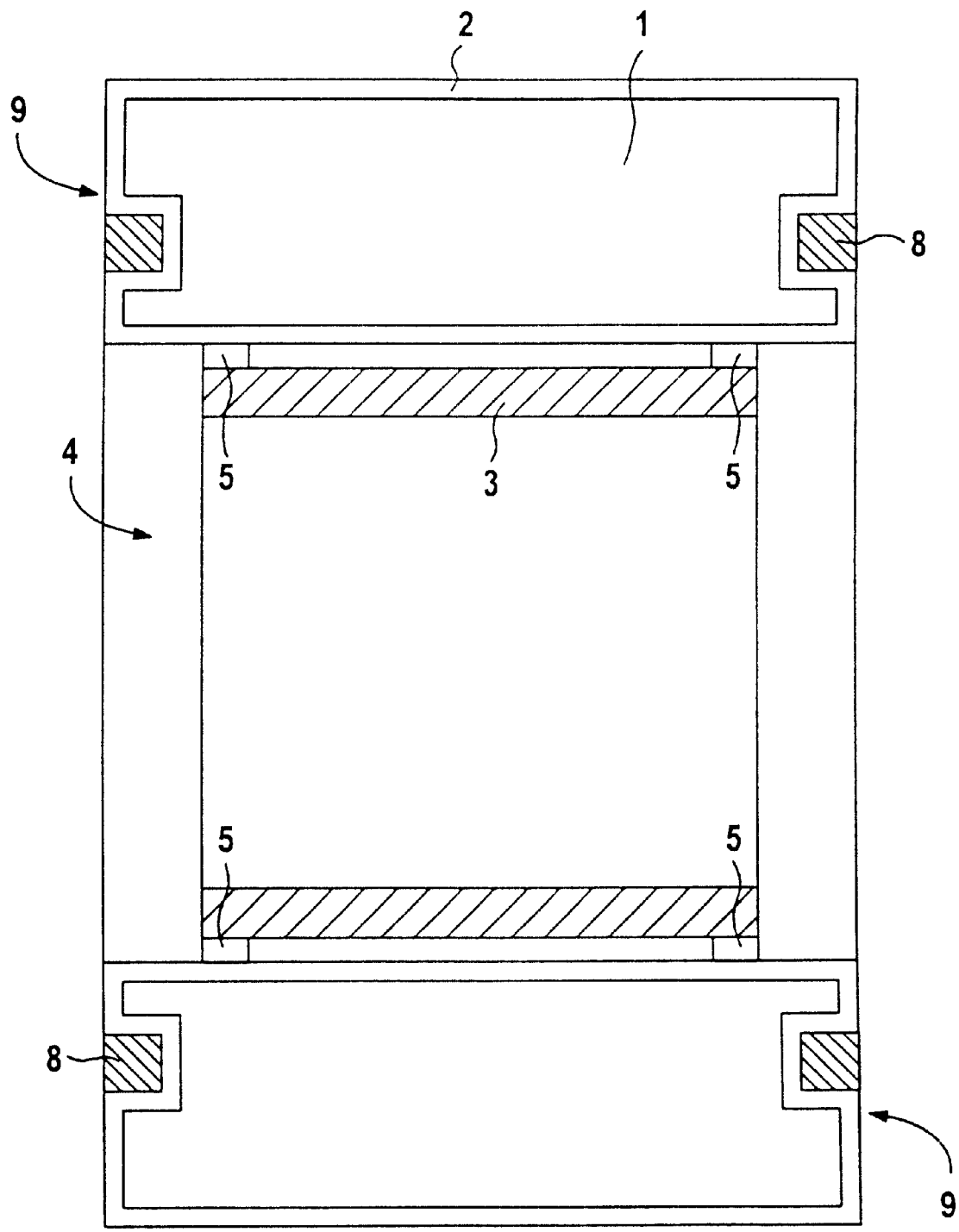
FIG. 2 is a longitudinal section through a magnetic resonance tomography apparatus in accordance with the invention with stiffening rings.

FIG. 2 shows the longitudinal section of a magnetic resonance tomography apparatus in a further embodiment of the invention. Compared to FIG. 1, the apparatus does not have a decoupling mechanism 6 in the envelope 2 of the hollow opening 4. Instead, the apparatus in FIG. 2 has a respective stiffening rings 8 in the regions of the two end faces 9 as a decoupling mechanism. Oscillations emanating from the gradient coil system 3 are reflected each stiffening ring 8, so that transmission of oscillations onto the overall outer envelope 2 is prevented. To this end, each stiffening ring 8 is rigidly connected to the envelope 2 at as many points as possible. This prevents the envelope 2 from vibrating under the stiffening ring 8 and thus transmitting oscillations past the stiffening ring 8. In order to achieve a high weight and, thus a high noise-reducing effect, as well as to avoid degradation of the magnetic resonance image quality, each stiffening ring 8 is composed of high-density, non-ferromagnetic material, for example non-magnetic steel or lead. The oscillation-reducing and thus the noise-reducing effect, is greater as the weight of the stiffening ring 8 is made larger. The frequency range for which a vibration damping occurs becomes larger as the seating surface with the envelope 2 is made larger. In an embodiment, the cross-section of the stiffening ring 8 is no smaller than approximately five by five centimeters. So that the stiffening ring 8 is as unobtrusive as possible from the outside, it is arranged in a corresponding depression of the envelope 2.

Figure 3:
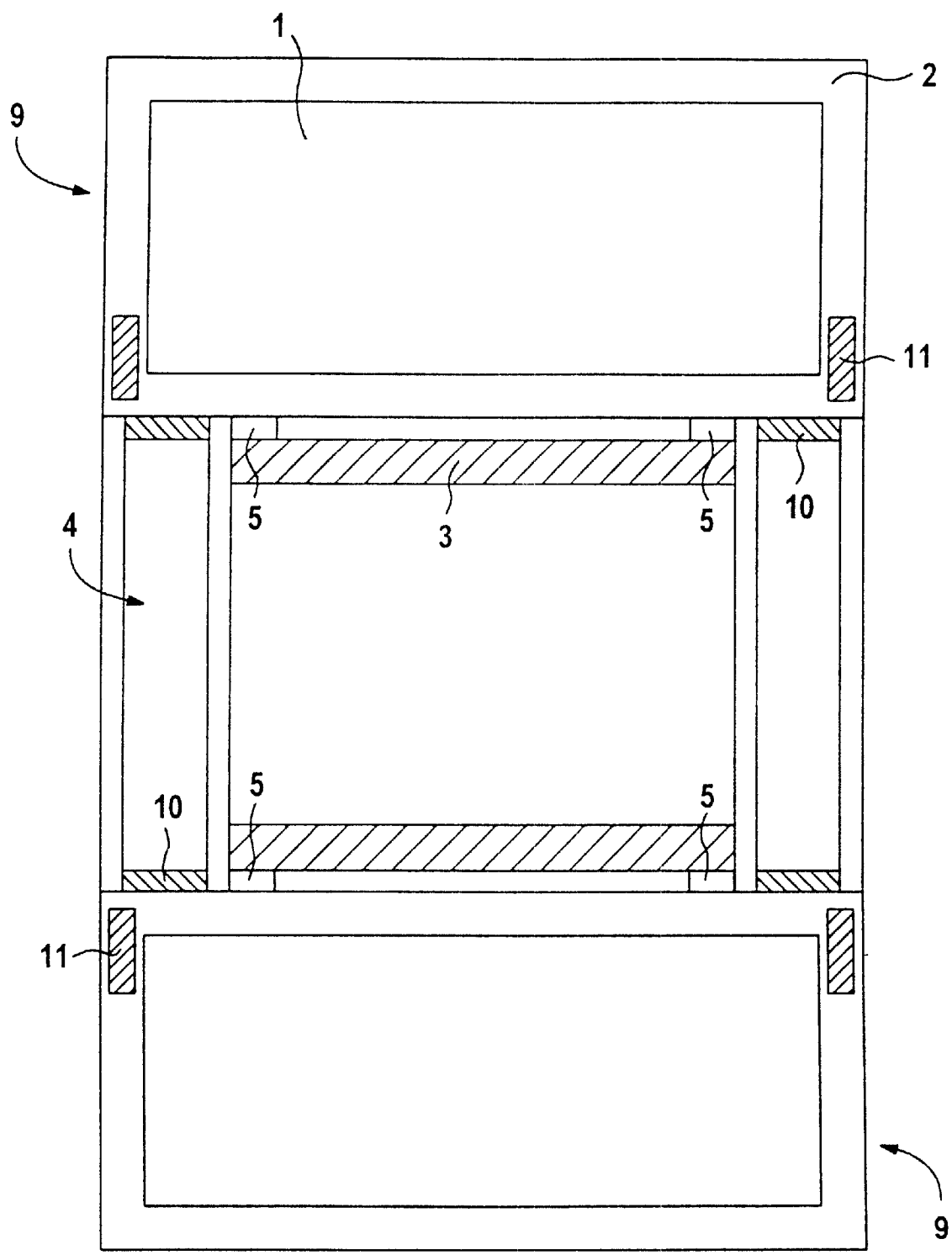
FIG. 3 is a longitudinal section through a magnetic resonance tomography apparatus in accordance with the invention with a decoupling mechanism that includes actuators and sensors.

FIG. 3 shows the longitudinal section of a magnetic resonance tomography apparatus in a further embodiment of the invention. Compared to the apparatus according to FIG. 2, the apparatus in FIG. 3 does not have any stiffening rings at the end faces 9. Instead, the envelope 2 has actuators 12 and sensors 13 as a decoupling arrangement that are disposed in annular regions 10 and 11 in or at the envelope 2. The actuators 12 and sensors 13 are secured in the annular regions 10 on the surface of the hollow opening 4 outside the connecting devices 5. The actuators 12 and sensors 13 are integrated into the envelope 2 at the two end faces 9 in the annular regions 11. For example, the actuators 12 and sensors 13 are implemented as piezo elements. The actuators 12 and sensors 13 form a control circuit. The sensors 13 detect oscillations which arise and control the actuators 12 such that the actuators oppose the sensed oscillations by modifying their spatial extent. As a result, oscillations of the gradient coil system 3 are not transmitted via their connecting devices 5 onto the entire outer envelope 2 of the basic field magnet system 1.

Figure 4:
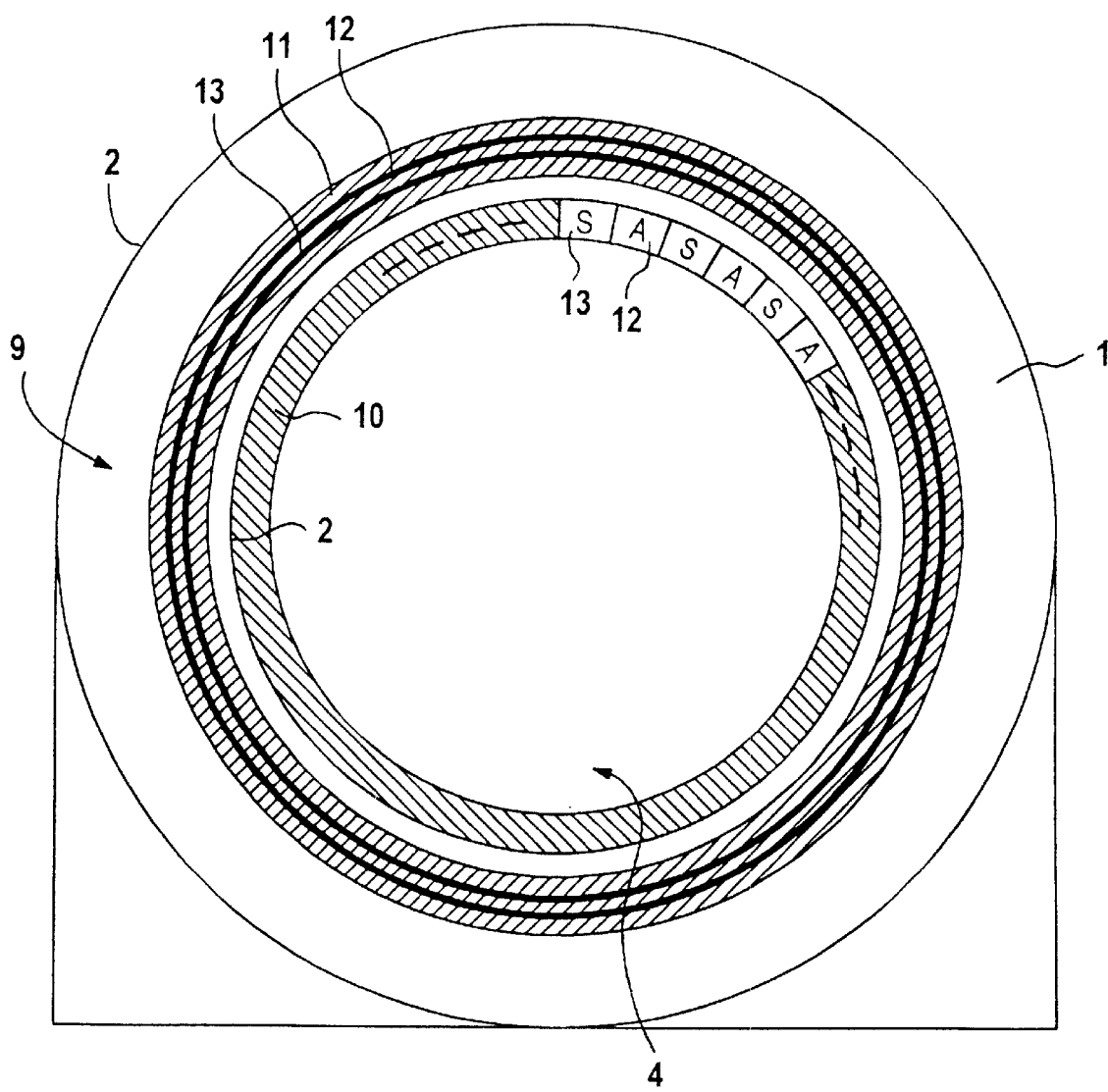
FIG. 4 is a cross-section through the magnetic resonance tomography apparatus of FIG. 3.

FIG. 4 shows a cross-section through the apparatus from FIG. 3. For example, actuators 12 and sensors 13 in the form of lamellae and/or films are connected in alternation to the envelope 2 rigidly and damping-free in the annular region 10. Actuators 12 and sensors 13 are integrated into the envelope in the annular region 11. The actuators 12 and/or sensors are advantageously fashioned as fibers.

Figure 5:
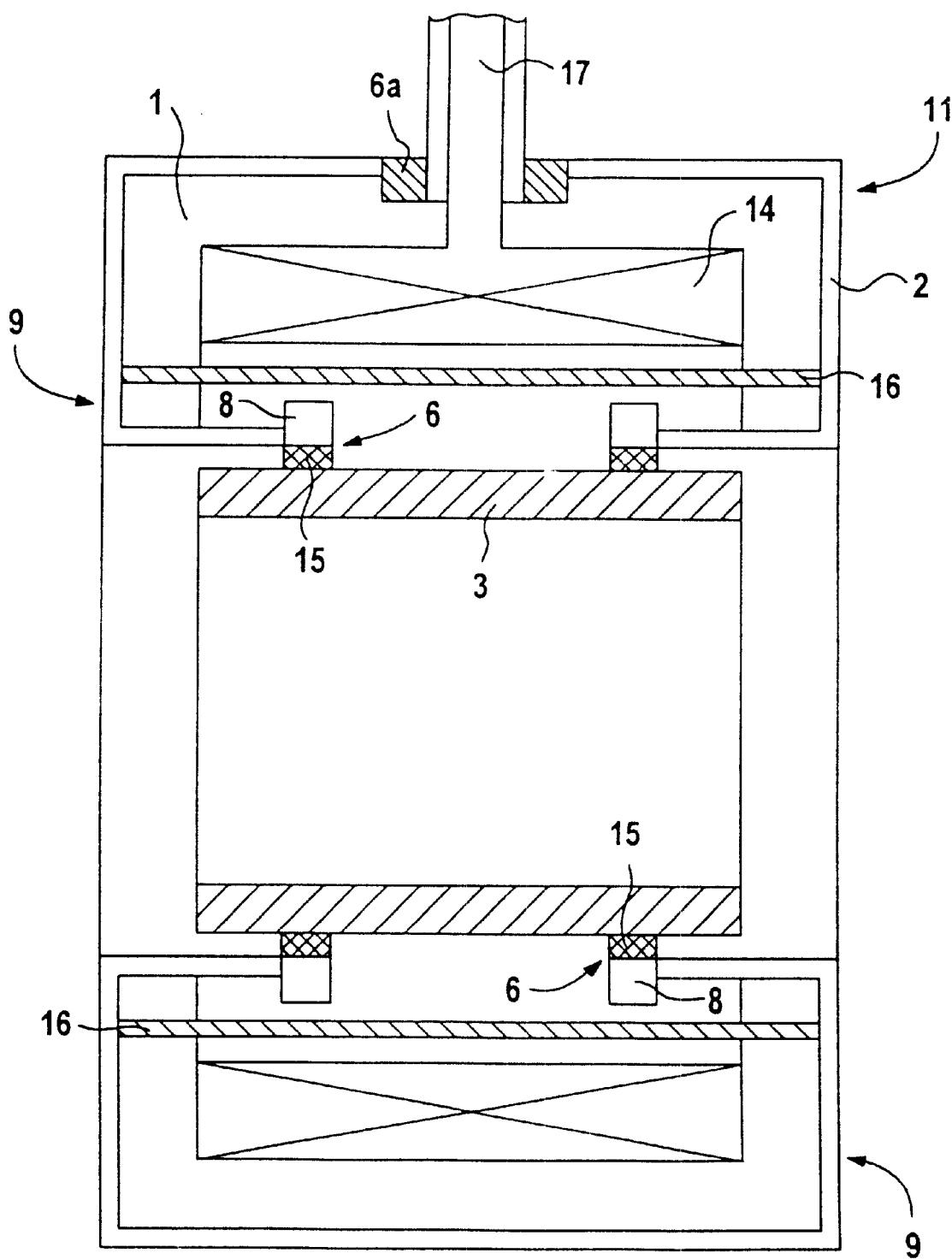
FIG. 5 is a longitudinal section through a magnetic resonance tomography apparatus in accordance with the invention with a decoupling mechanism for a cold head.

As a further embodiment of the invention, FIG. 5 shows a longitudinal section through a magnetic resonance tomography apparatus with a hollow-cylindrical basic field magnet system 1 having a superconducting coil arrangement 14. The gradient coil system 3 is connected to the outer envelope 2 of the basic field magnet system 1 via two rings 15 of elastic material as well as two stiffening rings 8. The stiffening rings 8 as well as the rings 15 of elastic material thereby form a decoupling mechanism 6. Further, the gradient coil system 3, the decoupling mechanism 6 and the outer envelope 2 simultaneously form a vacuum housing for the superconducting coil arrangement 14 the rings 15 of elastic material simultaneously function as connections between the gradient coil system 3 and the basic field magnet system 1. In view of the oscillation decoupling, the ring 15 of elastic material has properties similar to the bellows of FIG. 1. In order to compensate for a potential weakening of the structure of the hollow-cylindrical basic field magnet system 1 in the direction of the principal cylinder axis due to an absence of the outer envelope 2 between the stiffening rings 8, a longitudinal stiffening is attached between the end faces 9. The longitudinal stiffening 16 need not be circumferentially tubular, but can be an arrangement of a number of, for example, rod-shaped elements at individual angular positions. The magnetic resonance tomography apparatus with superconducting coil arrangement 14 has a cold head 17 that serves, among other things, for the coolant supply and power supply of the superconducting coil 14. For suppressing or damping transmission of vibrations from the cold head 17 onto the envelope 2 of the basic field magnet system 1, a decoupling mechanism 6a in an annular arrangement is arranged between the cold head 17 and the outer envelope 2 of the basic field magnet system 1 at the point of transition of the cold head 17 into the basic field magnet system 1.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography apparatus comprising:
   a basic field magnet system having an outer envelope;
   an oscillation source which produces mechanical oscillations; and
   said outer envelope of said basic field magnet system having a mechanical connection with said oscillation source via which said mechanical oscillations can propagate, and a decoupling mechanism formed partially by said outer envelope which prevents propagation of said mechanical oscillations from said oscillation source to at least a portion of said outer envelope.

2. A magnetic resonance tomography apparatus as claimed in claim 1 wherein said mechanical connection contains a portion of said decoupling mechanism.

3. A magnetic resonance tomography apparatus as claimed in claim 1 wherein said decoupling mechanism comprises an isolator which has mechanical properties for decoupling said oscillations from said oscillation source to at least said portion of said outer envelope.

4. A magnetic resonance tomography apparatus as claimed in claim 3 wherein said isolator is a bellows.

5. A magnetic resonance tomography apparatus as claimed in claim 3 wherein said isolator is an elastic material element.

6. A magnetic resonance tomography apparatus as claimed in claim 1 wherein said decoupling mechanism includes a plurality of actuators, each of said actuators having a spatial size which produces an oscillation-decoupling effect.

7. A magnetic resonance tomography apparatus as claimed in claim 6 wherein each of said actuators comprises a piezoelement.

8. A magnetic resonance tomography apparatus as claimed in claim 6 wherein said decoupling mechanism has a surface, and wherein each of said actuators is attached on said surface of said decoupling mechanism.

9. A magnetic resonance tomography apparatus as claimed in claim 6 wherein each of said actuators is structurally contained within said decoupling mechanism.

10. A magnetic resonance tomography apparatus as claimed in claim 6 wherein said actuators are selected from the group consisting of lamellae, fibers and films.

11. A magnetic resonance tomography apparatus as claimed in claim 6 wherein said decoupling mechanism comprises a plurality of sensors respectively disposed in immediate proximity to said plurality of actuators for detecting said oscillations, and said sensors being respectively connected to said actuators for controlling said actuators dependent on detected oscillations.

12. A magnetic resonance tomography apparatus as claimed in claim 11 wherein each of said sensors comprises a piezoelement.

13. A magnetic resonance tomography apparatus as claimed in claim 11 wherein said decoupling mechanism has a surface, and wherein each of said sensors is attached on said surface of said decoupling mechanism.

14. A magnetic resonance tomography apparatus as claimed in claim 11 wherein each of said sensors is structurally contained within said decoupling mechanism.

15. A magnetic resonance tomography apparatus as claimed in claim 11 wherein said sensors are selected from the group consisting of lamellae, fibers and films.

16. A magnetic resonance tomography apparatus as claimed in claim 1 wherein said decoupling mechanism includes a stiffening element.

17. A magnetic resonance tomography apparatus as claimed in claim 1 wherein said oscillation source is a gradient coil system.

18. A magnetic resonance tomography apparatus as claimed in claim 17 wherein said envelope has a region which is not covered by said gradient coil system, and wherein said decoupling mechanism is disposed in said region of said envelope which is not covered by said gradient coil system.

19. A magnetic resonance tomography apparatus as claimed in claim 18 wherein said decoupling mechanism is disposed along a closed curve proceeding on said envelope.

20. A magnetic resonance tomography apparatus as claimed in claim 19 wherein said envelope has a region which is covered by said gradient coil system, and wherein said closed curve comprises a closed boundary curve between said region of said envelope which is covered by said gradient coil system and said region of said envelope which is not covered by said gradient coil system.

21. A magnetic resonance tomography apparatus as claimed in claim 18 wherein said basic field magnet system is a tubular basic field magnet system having a hollow opening therein, and wherein said gradient coil system is connected to said basic field magnet system by said mechanical connection.

22. A magnetic resonance tomography apparatus as claimed in claim 21 wherein said tubular basic field magnet system has a first end and a second end, and wherein said mechanical connection comprises a first connection spaced from said first end and a second connection spaced from said second end, and wherein said decoupling mechanism comprises a first decoupling mechanism arrangement disposed between said first end and said first connection and a second decoupling mechanism arrangement disposed between said second end and said second connection.

23. A magnetic resonance tomography apparatus as claimed in claim 22 wherein said first and second decoupling mechanism arrangements are respectively disposed at annular regions at respectively adjacent said first end and said second end of said tubular basic field magnet system, in proximity to said hollow opening.

24. A magnetic resonance tomography apparatus as claimed in claim 23 wherein said first decoupling mechanism arrangement comprises a first stiffening ring and wherein said second decoupling mechanism arrangement comprises a second stiffening ring.

25. A magnetic resonance tomography apparatus as claimed in claim 24 wherein each of said first and second stiffening rings has a high density and is composed of non-ferromagnetic material.

26. A magnetic resonance tomography apparatus as claimed in claim 25 wherein said non-ferromagnetic material is selected from the group consisting of non-magnetic steel and lead.

27. A magnetic resonance tomography apparatus as claimed in claim 25 wherein each of said first and second stiffening rings is connected to said tubular basic field magnet system at a plurality of connection points.

28. A magnetic resonance tomography apparatus as claimed in claim 27 wherein each of said first and second stiffening rings is connected via said connection points to said outer envelope of said basic field magnet system.

29. A magnetic resonance tomography apparatus as claimed in claim 20 wherein said tubular basic field magnet system comprises a longitudinal stiffener proceeding in a direction of a principal axis of said tubular basic field magnet system.

30. A magnetic resonance tomography apparatus as claimed in claim 1 wherein said basic field magnet system is a superconducting basic field magnet system having a cold head, said cold head forming said oscillation source, and wherein said decoupling mechanism is disposed along a closed curve in a transition region between said cold head and a remainder of said basic field magnet system.

* * * * *